United States Patent [19]

Tanaka

[11] Patent Number: 5,129,955
[45] Date of Patent: Jul. 14, 1992

[54] WAFER CLEANING METHOD
[75] Inventor: Masato Tanaka, Shiga, Japan
[73] Assignee: Dainippon Screen Mfg. Co., Ltd., Japan
[21] Appl. No.: 462,014
[22] Filed: Jan. 8, 1990
[30] Foreign Application Priority Data Jan. 11, 1989 [JP] Japan .................. 1-5096
May 12, 1989 [JP] Japan .................. 1-120172

[51] Int. Cl.$^5$ .......................... B08B 3/08; C23G 1/02
[52] U.S. Cl. ................................. 134/2; 134/3; 134/26; 134/27; 134/28
[58] Field of Search ............. 134/2, 3, 26, 27, 28, 134/42

[56] References Cited
U.S. PATENT DOCUMENTS 4,239,661 12/1980 Muraoka et al. .................. 134/42
4,264,374 4/1981 Beyer et al. ...................... 134/28
4,339,340 7/1982 Muraoka et al. .................. 252/79.5

FOREIGN PATENT DOCUMENTS 63-48830 3/1988 Japan .

Primary Examiner—Theodore Morris
Assistant Examiner—Saeed Chaudhry
Attorney, Agent, or Firm—Ostrolenk, Faber, Gerb & Soffen

[57] ABSTRACT

A surface of a silicon wafer is treated with hydrogen fluoride. Subsequently, the surface is cleaned with choline, choline-derivative and/or tetraalkyl ammonium hydroxide. Impurities are removed from the surface by cations from the cleaning agent. Further, hydroxyl groups from the cleaning agent cause the surface to become hydrophilic, preventing the formation of droplets which would otherwise roll along and contaminate the surface.

3 Claims, 7 Drawing Sheets

FIG.7A

TESTING CONDITIONS (ACCORDING TO THE FLOW-CHART IN FIG 6(a))

| STEP | PROCESS | SPINNING RATE | TREATMENT TIME |
|---|---|---|---|
| S1 | SUPPLYING 5% SOLUTION OF HYDROGEN FLUORIDE | 1000 r.p.m. | 60 sec. |
|  | SPINNING-DRY | 3000 r.p.m. | 5 sec. |
| S1a | SUPPLYING CHOLINE | 20 r.p.m. | 10 sec. |
| S2 | RINSING WITH PURE WATER | 1000 r.p.m. | 60 sec. |
| S3 | SPINNING-DRY | 3000 r.p.m. | 20 sec. |

FIG.7B

RESULTS

| NO. | CLEANING AGENT | SURFACE PROPERTY | PARTICLES COUNTED |
|---|---|---|---|
| 1 | CHOLINE | HYDROPHILIC | 44 |
| 2 | $NH_4OH$ | HYDROPHOBIC | 164 |
| 3 | IPA* | HYDROPHOBIC | 134 |
| 4 | SURFACE-ACTIVE AGENT | HYDROPHOBIC | 111 |
| 5 | PURE WATER | HYDROPHOBIC | 136 |
| 6 | NaOH | HYDROPHOBIC | 136 |
| 7 | $H_2O_2$ | PARTIALLY HYDROPHILIC | 1105 |
| 8 | $HNO_3$ | PARTIALLY HYDROPHILIC | 1383 |

*: ISOPROPYL ALCOHOL

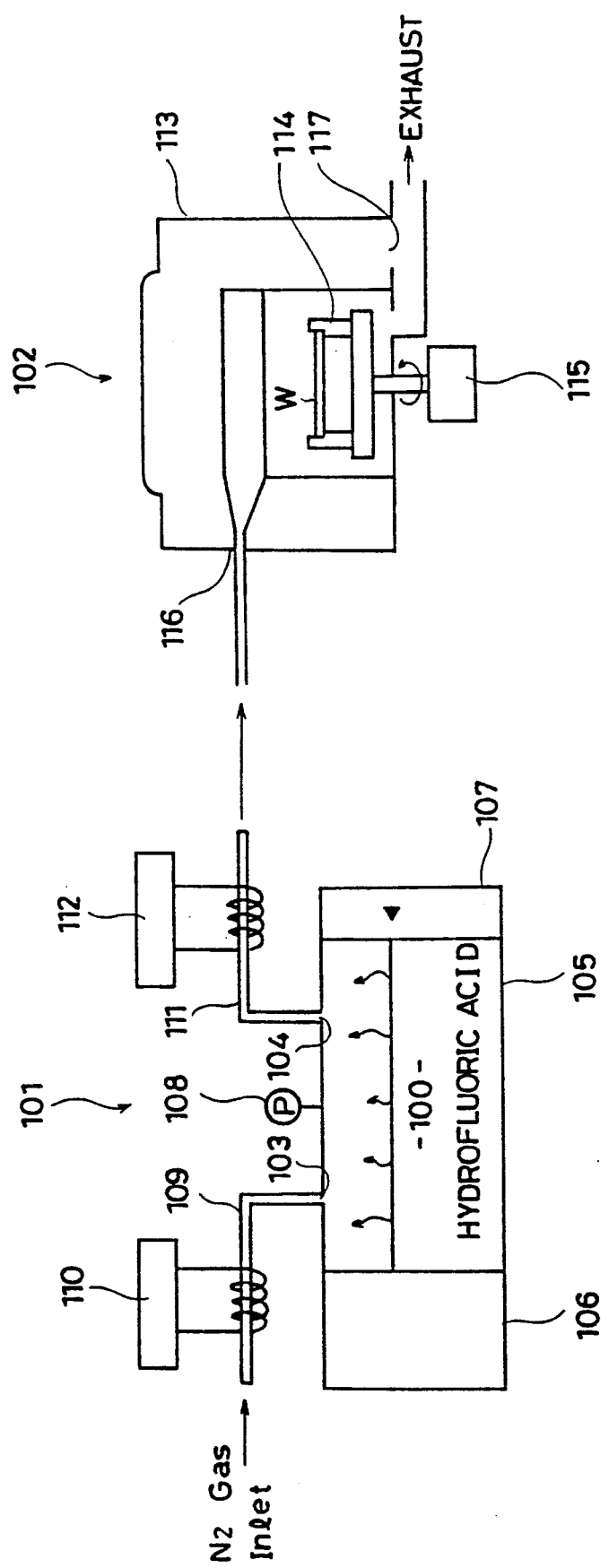

WAFER CLEANING METHOD

BACKGROUND OF THE INVENTION

1. Field of the Invention

The present invention relates to methods of cleaning thin substrates such as semiconductor wafers, and particularly to a wafer cleaning method executed preparatory to a film forming process. The invention also relates to an apparatus for performing such a method.

2. Description of the Related Art

When forming a film on a surface of a wafer, it is important to secure not only a desired film thickness and its uniformity but film strength as well. Sufficient film strength cannot be obtained when there are impurities such as particulate substances on the wafer surface Generally, the wafer surface is cleaned so as not to transfer contamination resulting from the wafer manufacturing process to subsequent processes. During this cleaning step, detrimental contaminants such as particulate, organic and inorganic substances are removed from the wafer surface prior to formation of a film thereon The necessity of cleaning the wafer surface is emphasized by Tatsuo Asamaki in his book entitled "Fundamentals of Film Formation (Second Edition)", fifth print, published Jun. 15, 1988 by Nikkan Kogyo Shinbun-sha, page 106. Asamaki states that the following substances must be removed preparatory to film formation:

(1) Dust, which often causes pinholes in the film.

(2) Fats and oils (organic substances), which weaken the cohesion between film and wafer.

(3) Inorganic substances and a layer of natural oxide, which cause the film to separate from the wafer surface The dust is removed by brushing, high pressure jet cleaning or supersonic wave cleaning. The organic substances are removed by acid or alkaline cleaning. The inorganic substances and the natural oxide layer are removed by dilute hydrofluoric acid.

A conventional procedure for cleaning the wafer surface will be described next with reference to FIG. 1. At preliminary cleaning step $S_0$, fats and oils are removed from the wafer surface by an organic solvent. This leaves a layer of natural oxide on the wafer surface.

At step $S_1$, the natural oxide layer is removed from the wafer surface by a treating solution containing fluorine. At step $S_2$, the wafer is rinsed with pure water H to remove the treating solution and to remove fine particles from the wafer surface. At step $S_3$, the wafer is spin-dried. Typically, the wafer is made of silicon. Hence, silicon is exposed on the wafer surface after the treating solution containing fluorine is removed (step $S_2$). The exposed silicon has been activated. The hydrofluoric acid treatment provided at step $S_1$ produces silicon fluoride ($SiF_4$). This silico fluoride reacts with the water to produce colloidal silicon dioxide ($SiO_2$) which tends to adhere to the activated silicon. Silicon oxide particles remaining on the wafer surface may form spots or stains called "haze". It is desirable to avoid such a situation.

A second problem yet to be solved is as follows: Since the exposed silicon of the wafer surface is hydrophobic, droplets 13 are formed during rinsing (step $S_2$) due to the surface tension of the water. Colloidal particles tend to concentrate on vapor-liquid boundaries of the droplets 13. During spin-drying (step $S_2$), the droplets 13 roll along the wafer surface such that the colloidal particles contained in the droplets 13 adhere to and recontaminate the wafer surface.

A third problem remaining to be solved is as follows: When the wafer is left in an oxygen-containing atmosphere for a long period of time, a layer of natural oxide is formed on its surface. The subsequently formed semiconductor film is superposed on the oxide layer and thus can be easily separated from the wafer surface.

There is a further problem to be solved. When the natural oxide layer is formed on the wafer surface while impurities such as inorganic substances remain on the wafer surface, it is difficult to remove the impurities. Such a situation must be avoided to maintain film quality, including film strength.

A method of preventing inorganic substances such as colloidal particles or metallic particles from adhering to a wafer surface is disclosed in Japanese Patent Laid-Open No. 63-48830, entitled "Semiconductor Surface Treating Method".

According to this method, the wafer surface is first treated with dilute hydrofluoric acid, and thereafter with a mixture of an aqueous solution of trialkylammonium hydroxide and hydrogen peroxide. It is stated in the above laid-open specification that the method disclosed therein is capable of efficiently removing metallic impurities such as iron or aluminum from the wafer surface, and reducing the number of particles remaining on the wafer surface.

This method, however, poses the following new problem. Hydrogen peroxide is an oxidizing agent, and is known to readily oxidize silicon. Thus, a layer of silicon oxide is formed again on the silicon wafer by the action of hydrogen peroxide. This causes separation of the subsequently formed semiconductor film as noted hereinbefore The above method does not secure sufficient film strength.

SUMMARY OF THE INVENTION

It is accordingly, an object of the present invention to provide an improved method and apparatus for efficiently removing impurities from a wafer surface.

Another object is to prevent a layer of natural oxide from being formed on the wafer surface after cleaning.

Another object is to prevent colloidal particles from adhering to the wafer surface during rinsing.

Another object is to prevent droplets carrying colloidal particles from being formed on the wafer surface after rinsing.

Another object is to maintain the wafer surface hydrophilic after cleaning, thereby preventing formation of a natural oxide layer on the wafer surface.

The present invention relates to an apparatus and method for cleaning a silicon wafer. The method includes the steps of: (a) treating a surface of the wafer with a treating agent, the treating agent including hydrogen fluoride; (b) subsequently, cleaning the surface with a cleaning agent and thereby causing the surface to become hydrophilic, the cleaning agent including at least one from the group consisting of choline, choline-derivative and tetraalkyl ammonium hydroxide; and (c) rinsing the surface with pure water.

The foregoing and other features and advantages of the present invention will become apparent from the following description of the invention which refers to the accompanying drawings.

BRIEF DESCRIPTION OF THE DRAWINGS

FIG. 7A is a table showing testing conditions, FIG. 7B is a table showing results of the tests conducted under the conditions shown in FIG. 7A, and FIG. 8 is a schematic partial view of a wafer surface cleaning apparatus according to another embodiment of the present invention.

DETAILED DESCRIPTION OF THE PREFERRED EMBODIMENTS

Figure 2:
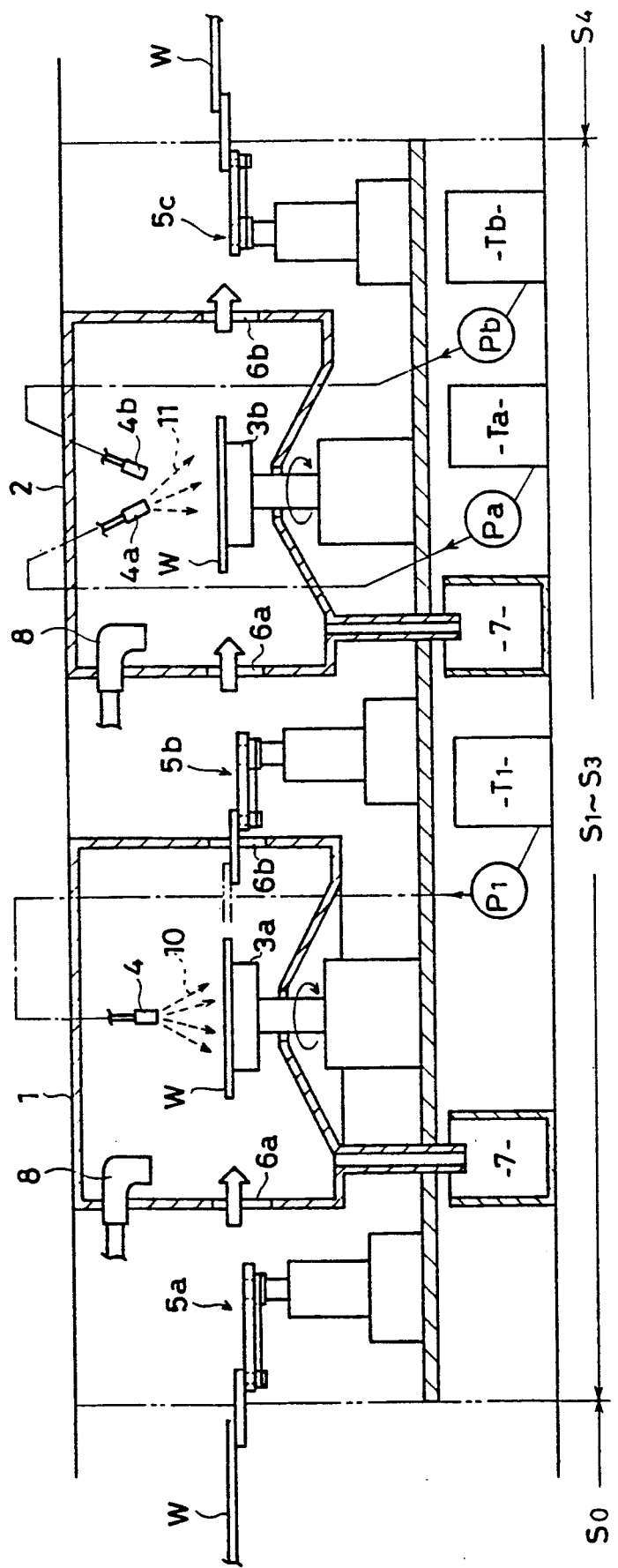
FIG. 2 is a schematic view of an apparatus for cleaning a wafer according to the present invention.

A wafer cleaning apparatus according to a preferred embodiment of the present invention will be described hereinafter with reference to the drawings. Referring to FIG. 2, the illustrated cleaning apparatus is utilized between a preceding cleaning step $S_0$ and a subsequent photo-resist coating step $S_4$.

The apparatus comprises a first treating chamber 1 and a second treating chamber 2. The treating chambers 1 and 2 house spin chucks 3a and 3b, respectively. The spin chucks 3a and 3b are horizontally rotatable. A wafer W is placed on the spin chucks 3a, 3b. A nozzle 4 and nozzles 4a and 4b deliver selected treating agents onto the wafer W. Horizontal swing type conveyors 5a, 5b and 5c deliver and receive wafers W to and from the spin chucks 3a, 3b.

Figure 1:
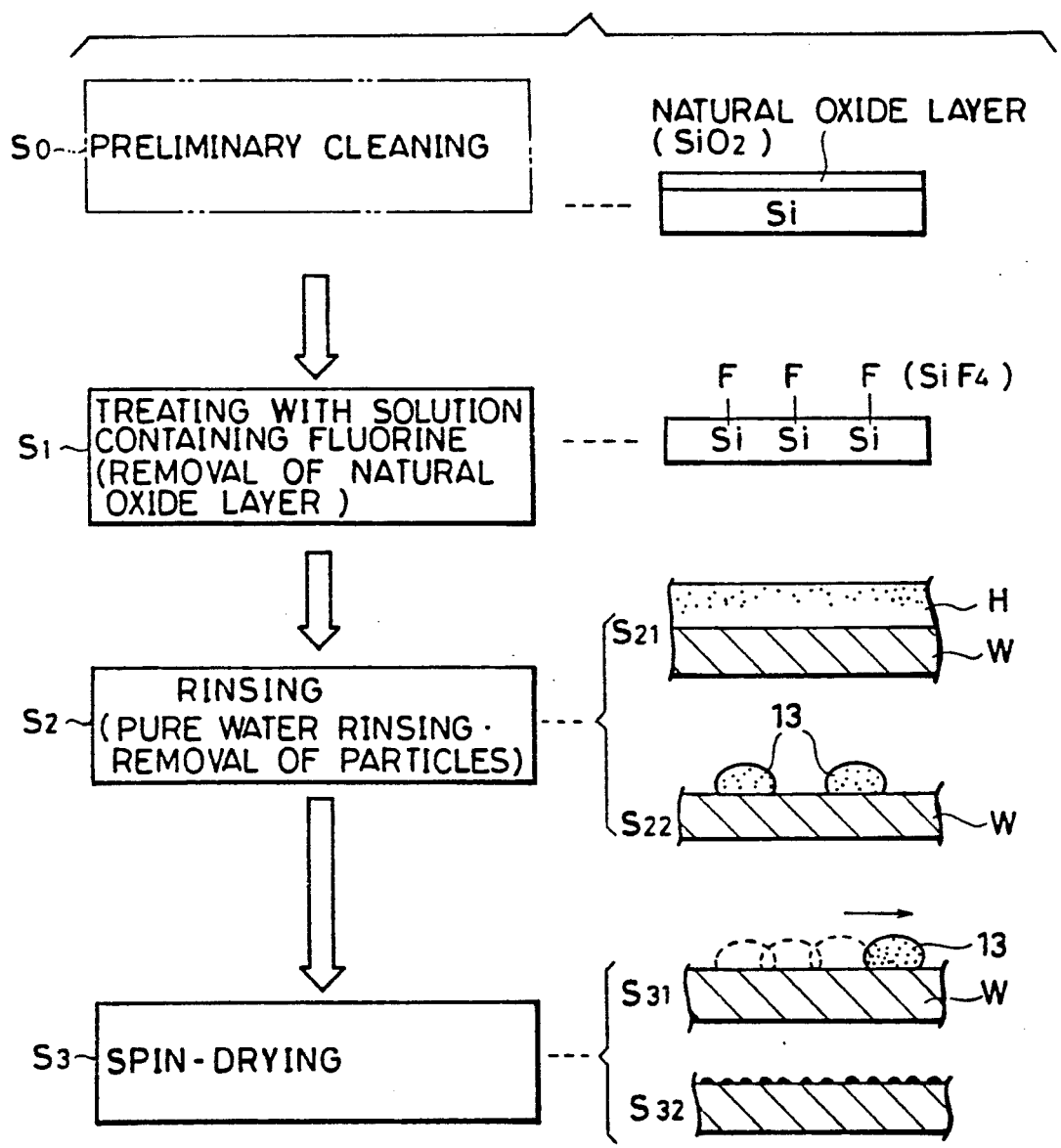
FIG. 1 is a flow chart illustrating a conventional method of cleaning a wafer surface and sectional views of a wafer in different stages of the method.
Figure 6:
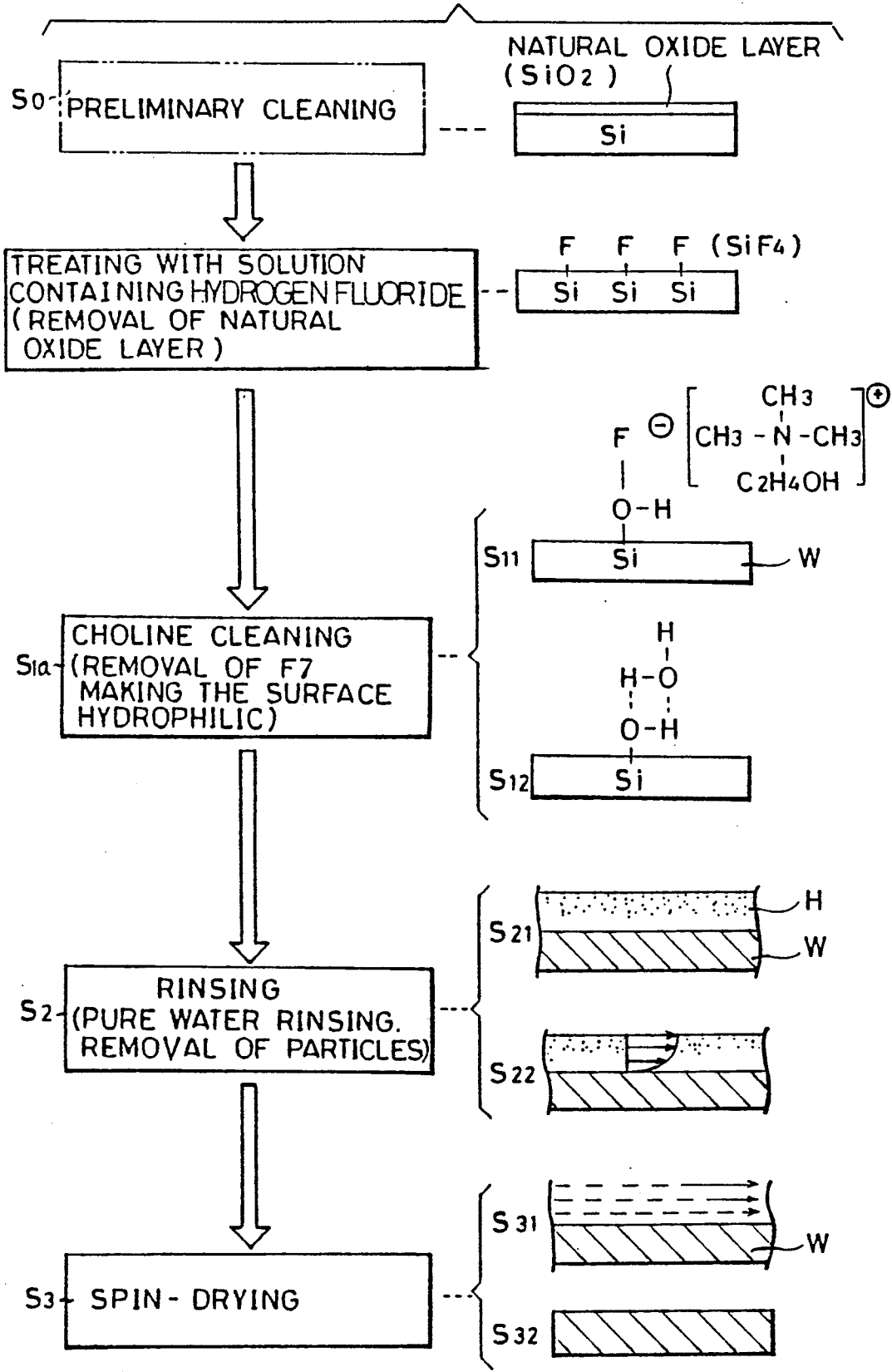
FIG. 6 is a flow chart illustrating a wafer surface cleaning method according to the present invention and sectional views of a wafer in different stages of the cleaning treatment.

In the first treating chamber 1, wafers W are treated by a surface treating agent containing hydrogen fluoride (step $S_1$, FIG. 6(a)) This step corresponds to step $S_1$ in FIG. 1. The second treating chamber 2 provides treatments including a cleaning step $S_{1a}$ (using choline) through a spin-drying step $S_3$.

Figure 3:
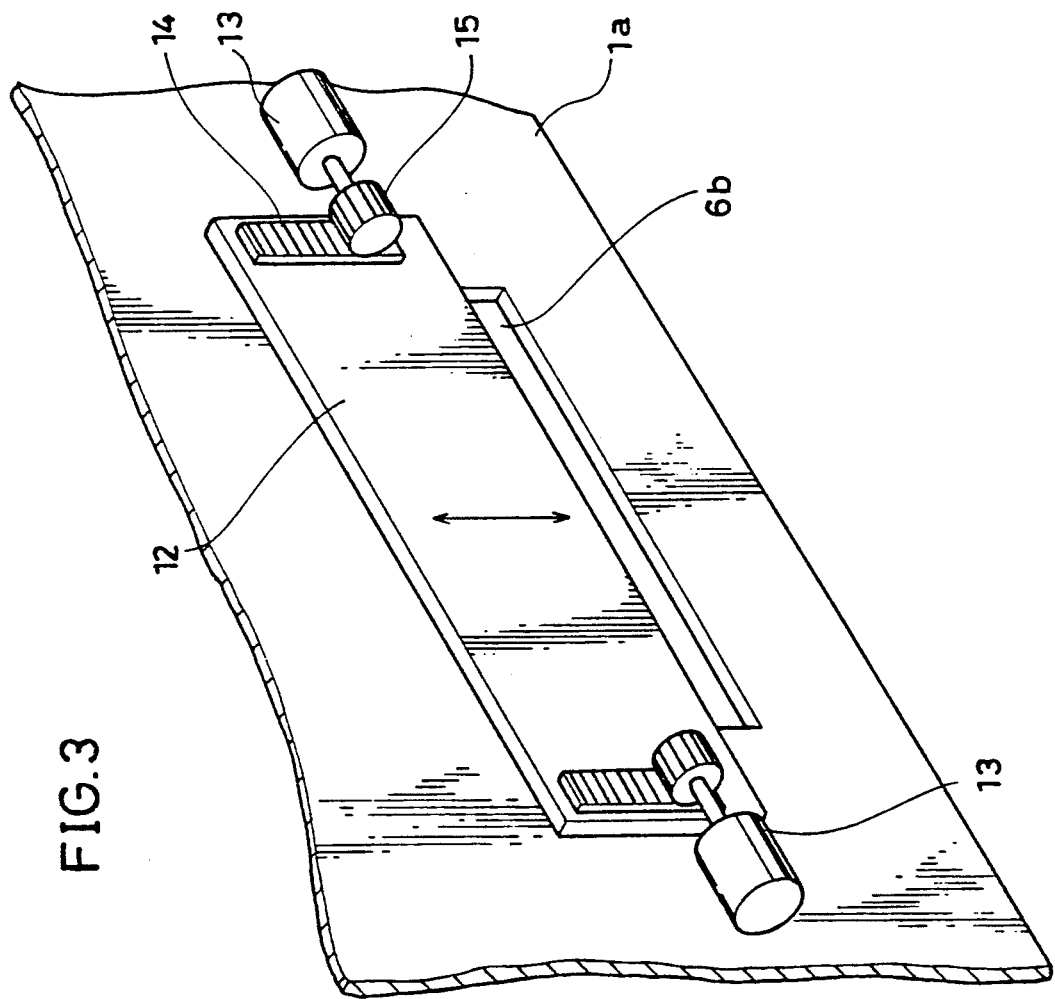
FIG. 3 is a perspective view of a shutter mechanism mounted in a surface treating chamber.

Referring to FIG. 2, each of the treating chambers 1 and 2 defines a wafer inlet 6a and a wafer outlet 6b. The wafer inlets 6a and outlets 6b are each provided with a shutter mechanism. As shown in FIG. 3, the shutter mechanism includes, for example, a pair of motors 13 secured to a side wall 1a and opposed to each other across the wafer outlet 6b, pinions 15 mounted on distal ends of rotary shafts of the respective motors 13, a shutter 12 slidable to cover the wafer outlet 6b, and racks 14 secured to opposite sides of the shutter 12 to mesh with the pinions 15, respectively. The two motors 13 are rotatable in the same predetermined direction to raise the shutter 12 and open the wafer outlet 6b. The outlet 6b is closed with a reversed rotation of the motors 13. The same shutter mechanism is provided for the wafer inlet 6a.

Figure 4:
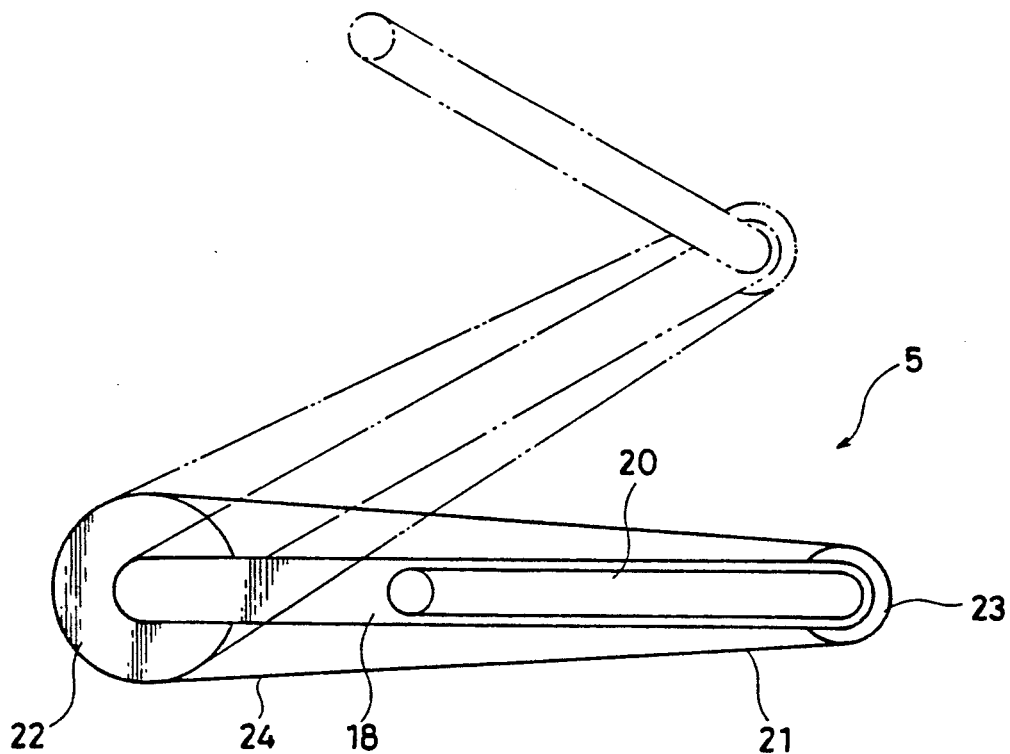
FIG. 4 is a plan view of a wafer conveyer.
Figure 5:
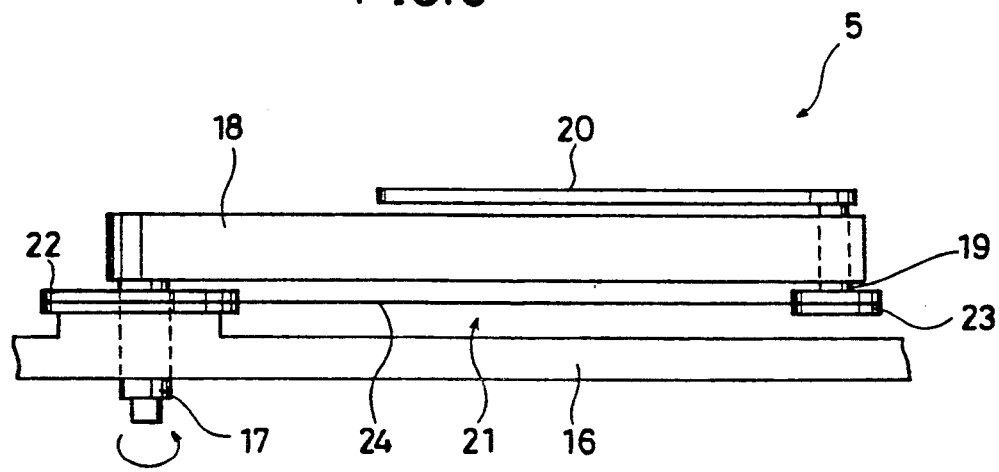
FIG. 5 is a side view of the wafer conveyer.

Referring to FIGS. 4 and 5, each of the wafer conveyers 5 includes a first arm 18 pivotable about a rotary axis 17 supported on a frame 16, a second arm 20 pivotable about a rotary axis 19 mounted at a free end of the first arm 18, and an arm drive mechanism 21 for driving the second arm 20 in interlocked relation with the movement of the first arm 18. The arm drive mechanism 21 includes a first pulley 22 fixed to the frame 16, a second pulley 23 fixed to a lower end of the rotary axis 19 to be rotatable therewith, and a transmission belt 24 for operatively interconnecting the first and second pulleys 22 and 23. The second pulley 23 has a smaller diameter than that of the first pulley 22.

In operation, the rotary axis 17 is rotated in one direction by a motor (not shown) such that the first arm 18 is turned in the counterclockwise direction. The first pulley 22 does not rotate, whereby the second pulley 23 rotates in the clockwise direction driven by the transmission belt 24. Since the pulley 23 has a smaller diameter than the pulley 22, the second arm 20 swings through a larger angle than the turning angle of the first arm 18 in the clockwise direction. The second arm 20 may include a suction port or the like in a distal region thereof for holding wafer W.

Referring again to FIG. 2, each of the treating chambers 1 and 2 includes a liquid drain 7 and an exhaust pipe 8 for discharging gas within the chamber. The pipe 8 is connected to a forced discharge means (not shown). These components prevent the atmosphere of an upstream treating chamber from flowing into a downstream treating chamber.

The apparatus further comprises a tank T1 disposed below the first treating chamber 1 for storing the surface treating agent containing hydrogen fluoride, a nozzle 4 disposed in the chamber 1 and connected to the tank T1, a pump for feeding the treating agent from the tank T1 to the nozzle 4, a tank Ta disposed below the second treating chamber 2 for storing liquid choline, a tank Tb disposed below the second treating chamber 2 for storing pure water, and pumps Pa and Pb for feeding the liquid choline and pure water from the tanks Ta and Tb to the nozzles 4a and 4b, respectively.

In operation, the wafer conveyer 5a first feeds a wafer W into the treating chamber 1 and the spin chuck 3a holds the wafer W. The nozzle 4 directs the surface treating agent 10 onto the wafer W as wafer W is supported and rotated by the spin chuck 3a (step). During this step, a layer of natural oxide ($SiO_2$) is removed from the surface of wafer W by the liquid agent 10.

The agent 10 comprises a 1:9 ratio of 50% hydrogen fluoride and water, namely a 5% solution of hydrogen fluoride. After step $S_1$, the wafer conveyer 5b transfers wafer W from the first treating chamber 1 to the second treating chamber 2 where wafer W is held by the spin chuck 3b. Choline cleaning step $S_{1a}$, rinsing step $S_2$ and spin drying step $S_3$ (FIG. 6(a)) are carried out successively and automatically in the second treating chamber 2.

During choline cleaning step $S_{1a}$, the cleaning liquid 11 (such as choline, choline-derivatives or Tetraalkyl Ammonium Hydroxide in pure water) is supplied to the surface of wafer W to etch the surface only to a minimal extent. Fluorine ions $F^-$ and inorganic substances present on the surface of wafer W are bonded to the cations of choline (FIG. 6(b), $S_{11}$,) to produce colloidal particles. At the same time, the wafer surface is covered by hydroxyl groups $OH^-$ which are bonded to the water molecules ($H_2O$) to render the wafer surface hydrophilic (FIG. 6(b), $S_{12}$,).

At rinsing step $S_2$, the nozzle 4b delivers pure water from the tank Tb to the surface of wafer W. Referring to FIG. 6(b), at ste $S_{21}$, a layer of pure water H is formed on the surface of wafer W. At this step, the colloidal particles produced at choline rinsing step $S_{1a}$ are drawn to the vapor-liquid boundary of the pure water layer H. Consequently, the colloidal particles become highly concentrated in the poximity of the vapor-liquid boundary.

To remove the colloidal particles from the surface of wafer W, the surface of wafer W is repeatedly cleaned with pure water and the wafer is repeatedly spun by the spin chuck $3b$. As a result, the colloidal particles concentrated at the vapor-liquid boundary are scattered together with the cleaning liquid by centrifugal force (FIG. $6(b)$, $S_{22}$).

One of the distinct features of this embodiment is that the surface of wafer W is made hydrophilic. Therefore, the surface of wafer W is free from the droplets 13 shown in FIG. $1(b)$. Due to the viscosity of pure water and the friction between the pure water and the surface of wafer W, pure water in the layer H moves fast on the vapor-liquid boundary and slowly in the proximity of the surface of wafer W. The colloidal particles concentrated in the proximity of the vapor-liquid boundary are thrown around together with the fast-moving surface water by centrifugal force, without ever adhering to the surface of wafer W. Consequently, the undesirable particles are removed entirely from the wafer surface.

At spin-drying step $S_3$, the supply of pure water is stopped and the spin chuck $3b$ is rotated at high speed to scatter away the pure water remaining on the surface W, until the wafer W is dry (FIG. $6(b)$, $S_{31}$, $S_{32}$).

The inventor has carried out tests with the described cleaning apparatus, and the data thereby obtained are shown in FIG. 7B. The conditions under which the tests were conducted are shown in FIG. 7A. Step $S_1$, step $S_2$ and step $S_3$ were performed under the same conditions. Only cleaning ste $S_{1a}$ was executed under varied conditions. A particle counter was used to count the number of particles having sizes at least 0.28 micrometers and remaining on a 6" diameter wafer surface after spin-drying step $S_3$.

As seen from FIG. 7B, line 1, a very small number of particles were observed to remain on the surface of wafer W after ste $S_{1a}$. Thus, the present invention is highly effective for cleaning the surface of wafer W.

In the foregoing embodiment, surface treatment is carried out in one chamber and cleaning with choline and pure water another. The surface treatment with hydrogen fluoride does not form undesirable colloidal particles through reaction with water. Therefore, mist containing hydrogen fluoride will never re-adhere to the wafer surface during cleaning.

Choline has the following chemical structure:

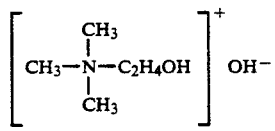

Choline has a high degree of purity, containing only trace amounts of undesirable heavy metals, impurities and the like. Choline etches a silicon wafer to a minimal extent with its hydroxyl groups ($OH^-$), thereby removing undesirable inorganic substances. Further, by being covered with the hydroxyl groups ($OH^-$), the surface of the wafer becomes hydrophilic.

Choline derivatives having similar properties to those of choline include Tetramethyl Ammonium Hydroxide and Tetraethyl Ammonium Hydroxide. These derivatives have the following chemical structures, respectively:

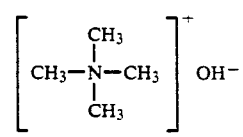

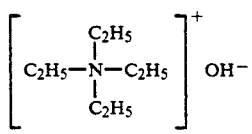

The above derivatives are generically referred to as tetraalkyl ammonium hydroxide whose chemical structure is expressed as follows:

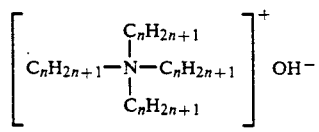

Further, choline derivatives can be used, expressed as follows:

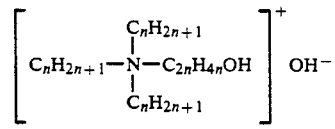

All of these have properties which are equivalent to those of choline.

That is:

(1) Referring to FIG. $6(b)$, at step $S_{11}$, the fluorine ions $F^-$ and other impurities remaining on the wafer surface are bonded to the cation $[\,]+$ of choline or its equivalents so as to be readily removable from the wafer surface.

(2) Referring to FIG. $6(b)$, at step $S_{12}$, the hydroxyl groups ($OH^-$) of choline are bonded to silicon exposed on the wafer surface, which is followed by bonding of water molecules ($H_2O$) with the hydroxyl groups ($OH^-$). As a result, a layer of water molecules is formed on the water surface. This gives the wafer surface a stable hydrophilic property to hamper formation of an oxide layer thereon.

(3) Referring to FIG. $6(b)$, at step $S_{21}$, colloidal particles are drawn to the vapor-liquid boundary of pure water during rinsing. However, no droplets are formed because the wafer surface is hydrophilic.

(4) Referring to FIG. $6(b)$, at step $S_{22}$, the wafer is spun during rinsing step $S_2$ whereby centrifugal force is generated to scatter the pure water from the wafer surface. At this time, by virtue of the viscosity of pure wafer, the closer it is to the vapor-liquid boundary, the faster the cleaning liquid moves.

(5) Consequently, referring to FIG. $6(b)$, at step $S_{31}$, during spin-drying, surficial parts of the pure water to which the colloidal particles have been drawn are scattered away first. At $S_{32}$, substantially no impurities remain on the wafer surface when spin-drying is completed. Wet treatment is performed in the foregoing embodiment. Vapor treatment, in which the surface treating agent containing hydrogen fluoride HF is supplied in vapor phase, may also be employed.

By vaporizing the surface treating agent, the particles contained therein can be removed. Thus, vapor treatment improves the rate of impurity removal. The same applies to cleaning with vaporized choline FIG. 8 schematically shows an apparatus for treating the surface of wafer W by using vapor containing hydrogen fluoride. An apparatus for cleaning the wafer surface with choline vapor may also be realized by precisely the same combination of components as shown in FIG. 8.

The apparatus illustrated in FIG. 8 comprises a hydrogen fluoride vapor generator 101 for generating hydrofluoric acid vapor containing hydrogen fluoride HF, and a treating unit 102 for receiving the hydrogen fluoride vapor from the generator 101 and for treating the surface of wafer W.

The generator 101 includes a hydrofluoric acid tank 105 having a nitrogen gas inlet 103 and a hydrogen fluoride outlet 104. Hydrofluoric acid is evaporated in the tank 105 in a concentration of azeotropic mixture (37.73% at 111.4° C.) under nitrogen pressure. The generator 101 further includes a temperature control device 106 associated with the tank 105 for maintaining the hydrofluoric acid at a predetermined constant temperature, a liquid amount control device 107 for maintaining the amount of hydrofluoric acid within the tank 105, and a pressure gauge 108 for detecting pressure in the tank 105.

A pipe 109 is connected to the nitrogen gas inlet 103. A heater 110 is provided on the pipe 109 for maintaining the nitrogen gas at a constant temperature. A pipe 111 is connected to the outlet 104. The pipe 111 has a heater 112 for heating the hydrogen fluoride vapor discharged from the tank 105 to prevent condensation of the vapor.

The treating unit 102 includes a chamber 113, a spin chuck 114 mounted in the chamber 113 for holding the wafer W, and a motor 115 for rotating the spin chuck 114. The chamber 113 defines a hydrogen fluoride vapor inlet 116 connected to the pipe 111 for introducing the hydrogen fluoride vapor into the chamber 113, and an exhaust opening 117 for discharging air from the chamber 113.

In operation, the wafer W is first placed on and held by the spin chuck 114. The interior of the chamber 113 is isolated from ambient atmosphere. The motor 115 rotates the spin chuck 114 to allow the wafer surface to be treated uniformly. Nitrogen gas is supplied through the nitrogen gas inlet 103 into the tank 105. The temperature control device 106 heats the hydrofluoric acid to produce the hydrogen fluoride vapor.

The hydrofluoric acid in the tank 105 is adapted to be in a concentration of azeotropic mixture. In other words, the ratio of hydrogen fluoride to water in the liquid mixture is retained in the vapor mixture produced therefrom.

By maintaining the hydrofluoric acid at the concentration of azeotropic mixture, the concentration of hydrofluoric acid remaining in the tank 105 remains constant. The amount of hydrofluoric acid in the tank 105 decreases with evaporation of hydrogen fluoride. However, it is only necessary for the device 107 to replenish the tank 105 with an appropriate amount of hydrofluoric acid in the concentration of azeotropic mixture. This is because the pressure and temperature in the tank 105 are adjusted by the heater 110, temperature control device 106 and pressure gauge 108 to maintain the hydrofluoric acid at the concentration of azeotropic mixture. In this way, the mixing ratio between hydrofluoric acid vapor and water vapor as produced from the vapor generator 101 may easily be maintained constant.

When nitrogen is supplied to the tank 105, a reduced amount of hydrogen fluoride is produced in the tank 105. Nevertheless, the hydrofluoric acid is maintained at the concentration of azeotropic mixture. Further, the hydrofluoric acid vapor may be supplied in a relatively low concentration in a stable manner by setting the nitrogen gas to a relatively high pressure. This provides the advantage of improved safety in the event of an accident. Using a large quantity of noxious hydrogen fluoride vapor would be less safe.

The hydrogen fluoride vapor thus produced enters the pipe 111 through the exhaust outlet 104 and is led into the chamber 113 through the hydrogen fluoride inlet 116. The heater 112 maintains the pipe 111 at a constant temperature to prevent condensation of the hydrogen fluoride vapor.

Wafer W is spun in the hydrogen fluoride atmosphere inside the chamber 113. As a result, the surface of wafer W is treated with hydrogen fluoride. The atmosphere in the chamber 113 is exhausted through the exhaust opening 117 by a forced exhaust means (not shown).

During the vapor treatment shown in FIG. 8, substantially all impurities and the like in the hydrofluoric acid are removed. Advantageously, therefore, even less impurities and other matters will remain on the surface of wafer W.

Tests were conducted under the conditions shown in FIG. 7A. When vapor treatment was effected for 60 seconds with the wafer W spun at about 10 rpm, no more than 10 particles remained on the wafer surface after cleaning with choline. This shows that vapor treatment provides an improved particle removal rate.

As mentioned hereinbefore, the apparatus as shown in FIG. 8 may also be used for cleaning with choline. The amount of impurities remaining on the wafer surface will thereby be reduced still further.

In the described embodiment, step $S_{1a}$ (cleaning with choline) to step $S_3$ (spin-drying) are carried out in the second treating chamber 2. However, the present invention may be practiced otherwise; a third chamber or further downstream chambers may be provided for rinsing (step $S_2$) and spin-drying (step $S_3$).

The present invention is not limited to the use of swing type wafer conveyers 5a, 5b and 5c. For example, the wafers may be transported by a belt conveyer.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of cleaning a surface of a wafer, and of preventing natural oxide from reforming on the surface after cleaning, the method comprising the steps of:
   (a) treating a surface of a silicon wafer with a treating agent, said treating agent including hydrogen fluoride, and thereby removing natural oxide formed on said surface and rendering said surface hydrophobic;
   (b) subsequently, cleaning said surface with a cleaning agent, wherein said cleaning agent includes at least one from the group consisting of choline, choline-derivative and tetraalkyl ammonium hydroxide, wherein said cleaning agent does not include hydrogen peroxide, and thereby: (1) producing collodial particles, (2) causing said surface of said wafer to become hydrophilic, and (3) preventing natural oxide from reforming on said surface after said cleaning;

(c) rinsing said surface with pure water and thereby forming a layer of water on said surface, said colloidal particles being drawn to and concentrated at a vapor-liquid boundary of said layer of water; and (d) spin drying said surface such that surface portion of said layer of water, including said vapor-liquid boundary and said colloidal particles, are scattered away by centrifugal force.

2. A wafer cleaning method as claimed in claim 1, wherein said treating agent is applied to said surface as a liquid.

3. A wafer cleaning method as claimed in claim 1, wherein said treating agent is applied to said surface as a vapor.

* * * * *